US012588503B2

(12) United States Patent
Iwamoto

(10) Patent No.: US 12,588,503 B2
(45) Date of Patent: Mar. 24, 2026

(54) ELECTRONIC DEVICE

(71) Applicant: Murata Manufacturing Co., Ltd., Nagaokakyo (JP)

(72) Inventor: Takashi Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 368 days.

(21) Appl. No.: 18/207,700

(22) Filed: Jun. 9, 2023

(65) Prior Publication Data

US 2023/0317550 A1    Oct. 5, 2023

Related U.S. Application Data

(63) Continuation of application No. PCT/JP2021/045552, filed on Dec. 10, 2021.

(30) Foreign Application Priority Data

Jan. 4, 2021    (JP) .................................. 2021-000079

(51) Int. Cl.
*H01L 23/373*    (2006.01)
*H03H 9/25*    (2006.01)
*H10N 30/853*    (2023.01)

(52) U.S. Cl.
CPC ........... *H01L 23/3735* (2013.01); *H03H 9/25* (2013.01); *H10N 30/8542* (2023.02)

(58) Field of Classification Search
CPC ............ H03H 9/02574; H10N 30/8542; H01L 23/36; H01L 23/3736
See application file for complete search history.

(56) References Cited

U.S. PATENT DOCUMENTS

| | | | | |
|---|---|---|---|---|
| 6,763,881 | B1 * | 7/2004 | Wagner | ............... H01L 23/3736 |
| | | | | 361/708 |
| 2002/0074146 | A1 | 6/2002 | Okubora | |
| 2004/0089928 | A1 | 5/2004 | Nakajima et al. | |
| 2013/0113576 | A1 * | 5/2013 | Inoue | ....................... H03H 9/70 |
| | | | | 333/195 |

(Continued)

FOREIGN PATENT DOCUMENTS

| | | |
|---|---|---|
| JP | 2000114413 A | 4/2000 |
| JP | 2004165281 A | 6/2004 |

(Continued)

OTHER PUBLICATIONS

International Search Report in PCT/JP2021/045552, mailed Feb. 1, 2022, 3 pages.

(Continued)

*Primary Examiner* — Evren Seven
(74) *Attorney, Agent, or Firm* — Keating & Bennett, LLP

(57)    ABSTRACT

An electronic device includes a substrate, a support body, and a conductive film. The substrate is a piezoelectric substrate or a compound semiconductor substrate including a first main surface with functional elements. The support body is provided at a second main surface of the substrate opposite to the first main surface and has a higher thermal conductivity than the substrate. The conductive film is located in a through hole extending through the support body and has a higher thermal conductivity than the support body.

12 Claims, 4 Drawing Sheets

(56)         References Cited

U.S. PATENT DOCUMENTS

| | | | | |
|---|---|---|---|---|
| 2014/0307390 A1* | 10/2014 | Baker | ..................... | H01L 23/42 |
| | | | | 361/709 |
| 2016/0277003 A1* | 9/2016 | Kikuchi et al. | .... | H03H 9/14541 |
| 2017/0213793 A1* | 7/2017 | Hurwitz | .............. | H01L 23/5389 |
| 2019/0165758 A1* | 5/2019 | Sakai | ................. | H03H 9/02866 |
| 2019/0181828 A1* | 6/2019 | Iwamoto | ............ | H03H 9/02897 |
| 2020/0235033 A1* | 7/2020 | Lee | ...................... | B23K 35/302 |
| 2020/0321937 A1 | 10/2020 | Kishi et al. | | |
| 2020/0321938 A1* | 10/2020 | Sawamura | ............... | H03H 9/05 |

FOREIGN PATENT DOCUMENTS

| | | | |
|---|---|---|---|
| WO | 2019124127 A1 | 6/2019 |
| WO | 2019124128 A1 | 6/2019 |

OTHER PUBLICATIONS

Written Opinion in PCT/JP2021/045552, mailed Feb. 1, 2022, 4 pages.

* cited by examiner

ELECTRONIC DEVICE

CROSS REFERENCE TO RELATED APPLICATIONS

This application claims the benefit of priority to Japanese Patent Application No. 2021-000079 filed on Jan. 4, 2021 and is a Continuation application of PCT Application No. PCT/JP2021/045552 filed on Dec. 10, 2021. The entire contents of each application are hereby incorporated herein by reference.

BACKGROUND OF THE INVENTION

1. Field of the Invention

The present invention relates to an electronic device on which a functional element substrate provided with a functional element is mounted.

2. Description of the Related Art

An electronic device on which a functional element substrate provided with a functional element, such as an integrated circuit, is mounted, is provided with a heat sink and the like so that heat that is generated during driving from the functional element and wiring is dissipated to the outside. Specifically, the electronic device described in Japanese Unexamined Patent Application Publication No. 2004-165281 has a face-up structure in which a semiconductor chip (functional element substrate) is provided at a base substrate such that a main surface thereof at which a functional element and an electrode are disposed faces upward. Therefore, a terminal is led out to the outside from the electrode disposed at the main surface of the semiconductor chip by wire wiring, which increases the size of the chip. In the electronic device, the main surface side on which the functional element and the electrode are disposed is sealed with a mold resin, and a heat sink is provided at a back surface of the semiconductor chip opposite to the main surface.

SUMMARY OF THE INVENTION

It is possible in the electronic device in Japanese Unexamined Patent Application Publication No. 2004-165281 if the material of the semiconductor chip is silicon (Si) to transfer heat that is generated from the functional element on the main surface side of the semiconductor chip to the back surface of the semiconductor chip and dissipate the heat at the heat sink. The material of the semiconductor chip is, however, not limited to silicon and may be a compound semiconductor or the like. The thermal conductivity of compound semiconductors is lower than the thermal conductivity of silicon. Therefore, in the configuration described in Japanese Unexamined Patent Application Publication No. 2004-165281, there is a likelihood that the heat generated from the functional element is not sufficiently transferred to the back side (second main surface) of the semiconductor chip from the main surface (first main surface) side of the semiconductor chip and deteriorates the heat dissipation.

Thus, preferred embodiments of the present invention provide electronic devices each capable of improving heat dissipation by dissipating heat from, in a functional element substrate including a first main surface provided with a functional element, a second main surface opposite to the first main surface.

An electronic device according to one aspect of a preferred embodiment of the present disclosure includes a functional element substrate including a first main surface provided with a functional element that is a piezoelectric substrate or a compound semiconductor substrate, a support body that is provided at a second main surface of the functional element substrate opposite to the first main surface, the support body having a higher thermal conductivity than the functional element substrate, and a through body in a through hole extending through the support body, the through body having a higher thermal conductivity than the support body.

According to one aspect of a preferred embodiment of the present disclosure, the through body in the through hole extending through the support body has a higher thermal conductivity than the support body, and it is thus possible to improve heat dissipation by dissipating heat from, in the functional element substrate including the first main surface provided with the functional element, the second main surface of the functional element substrate opposite to the first main surface.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 9 is a sectional view of another different electronic device according to Preferred Embodiment 3 of the present invention.

FIG. 10 is a sectional view of an electronic device according to a modification of a preferred embodiment of the present invention.

DETAILED DESCRIPTION OF THE PREFERRED EMBODIMENTS

Hereinafter, electronic devices according to preferred embodiments will be described with reference to the drawings. In the following description, the same components are given the same signs. The names and functions of those components are also the same. Therefore, those components will not be described in detail repeatedly.

Preferred Embodiment 1

Figure 1:
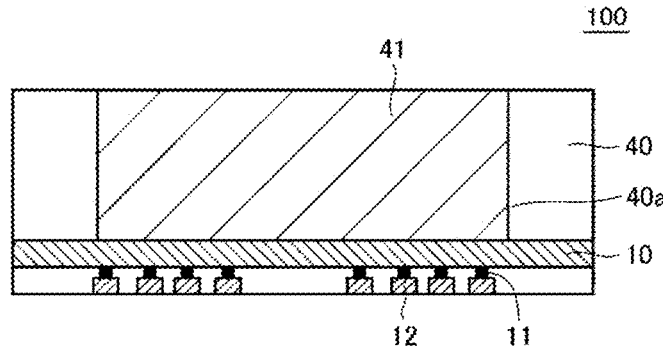
FIG. 1 is a sectional view of an electronic device according to Preferred Embodiment 1 of the present invention.

FIG. 1 is a sectional view of an electronic device 100 according to Preferred Embodiment 1. In the electronic device 100 according to Preferred Embodiment 1, functional elements 11 are provided at one main surface (first main surface) of a substrate 10. The functional elements 11 are each provided with an electrode 12 (functional element electrode), and the electrode 12 and an electrode on a base substrate, not illustrated, are electrically connected to each other by solder or a conductive paste, thereby enabling supply of electric power and a signal to the functional elements 11 from the base substrate.

When the functional elements 11 are operated by supplying electric power and a signal to the functional elements 11 from the base substrate, heat is generated in the functional elements 11 and the electrodes 12 during operation. It is possible, if a material such as silicon (Si) having high thermal conductivity is used in the substrate 10, to transfer the heat generated in the functional elements 11 and the electrodes 12 to the other main surface (second main surface) side of the substrate 10 through the substrate 10 and dissipate the heat. Incidentally, the thermal conductivity of silicon is about 160 W/(m·k) to about 200 W/(m·k), for example.

The substrate 10 is, however, a piezoelectric substrate or a compound semiconductor substrate. The material used in the piezoelectric substrate is, for example, crystal, $LiTaO_3$, $LiNbO_3$, $KNbO_3$, $La_3Ga_5SiO_{14}$, $Li_2B_4O_7$, or the like, and the material used in the compound semiconductor substrate is, for example, GaAs, GaN, or the like. Any of the materials is a material that has lower thermal conductivity than silicon and the like, and there is a likelihood of the materials being not able to sufficiently transfer the heat generated in the functional elements 11 and the electrodes 12 to the other main surface side of the substrate 10 through the substrate 10 and dissipate the heat. Incidentally, the thermal conductivity of $LiTaO_3$ and $LiNbO_3$ is about 3 W/(m·k) to about 5 W/(m·k), for example. The thermal conductivity of GaAs is about 55 W/(m·k), for example. The thermal conductivity of GaN is about 100 W/(m·k), for example.

Thus, the electronic device 100 according to Preferred Embodiment 1 includes a heat conduction path along which the heat that is generated in the functional elements 11 and the electrodes 12 is transferred to the other main surface side of the substrate 10. Specifically, in the electronic device 100, a support body 40 that has a higher thermal conductivity than the substrate 10 is provided at the other main surface (the main surface of the substrate 10 opposite to the main surface provided with the functional elements 11) of the substrate 10. The material used in the support body 40 is a conductive paste solidified material or the like based on silicon (Si), silicon carbide (SiC), aluminum oxide (for example, $Al_2O_3$), boron nitride (BN), aluminum nitride (AlN), silicon nitride, copper (Cu), nickel (Ni), or silver (Ag). Incidentally, the thermal conductivity of copper is about 300 W/(m·k) to about 400 W/(m·k), for example. The thermal conductivity of silicon carbide is about 200 W/(m·k), for example. The thermal conductivity of boron nitride is about 150 W/(m·k) to about 200 W/(m·k), for example. The thermal conductivity of aluminum nitride is about 150 W/(m·k) to 180 W/(m·k), for example.

The thickness of the substrate 10 can be reduced by providing the support body 40. By combining the substrate 10 and the support body 40 to provide a substrate having a predetermined thickness, the thickness of the substrate 10 is reduced to thereby, while maintaining the characteristics of the substrate 10, reduce a portion having low thermal conductivity and to increase the thickness of the support body 40 to thereby increase a portion having high thermal conductivity. Consequently, the heat generated in the functional elements 11 and the electrodes 12 is transferred to the support body 40 and a metal body 50 efficiently, which improves heat dissipation.

In addition, in the electronic device 100, a through hole 40a is formed in the other main surface of the substrate 10, and a conductive film 41 having a higher thermal conductivity than the support body 40 is formed in the formed through hole 40a. The conductive film 41 is made of a multilayer structure that contains at least one of, for example, copper (Cu), gold (Au), tungsten (W), and nickel (Ni) or an alloy that contains at least one of copper (Cu), gold (Au), tungsten (W), and nickel (Ni). The conductive film 41 is in contact with the other main surface of the substrate 10. Therefore, due to the conductive film 41 provided in the through hole 40a of the support body 40, the electronic device 100 can further improve the heat dissipation from the other main surface of the substrate 10. The conductive film 41 is a through body extending through the support body 40 and is preferably provided at a position where at least a portion of the conductive film 41 overlaps, in the substrate 10 in plan view from the support body 40, a region in which the functional elements 11 are provided. With the region of the conductive film 41 and the region in which the functional elements 11 are provided overlapping each other in plan view from the support body 40, the heat generated in the functional elements 11 can be efficiently transferred to the conductive film 41.

Figure 2:
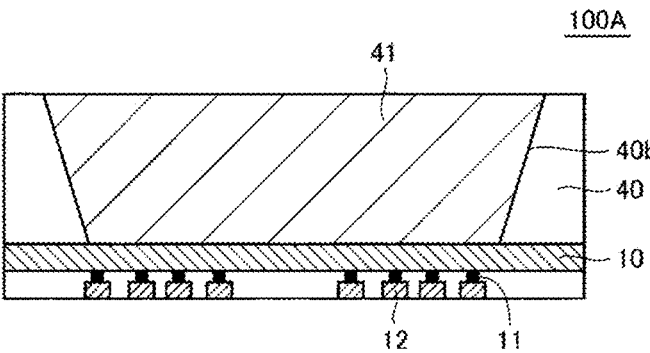
FIG. 2 is a sectional view of a different electronic device according to Preferred Embodiment 1 of the present invention.

In the electronic device 100 illustrated in FIG. 1, the conductive film 41 preferably has a prismatic shape or a cylindrical shape, for example. In other words, the conductive film 41 has a constant cross-sectional area in plan view from the support body 40. The shape of the conductive film 41 is, however, not limited thereto. For example, the shape of the conductive film 41 may be a tapered shape. FIG. 2 is a sectional view of a different electronic device 100A according to Preferred Embodiment 1. Note that the same components of the electronic device 100A illustrated in FIG. 2 as the components of the electronic device 100 illustrated in FIG. 1 are given the same signs and will not be described in detail repeatedly.

In the electronic device 100A, a through hole 40b having a tapered shape is formed in the support body 40. The conductive film 41 that has a higher thermal conductivity than the support body 40 is formed in the through hole 40b. Therefore, the conductive film 41 has a tapered shape and has a sectional shape that widens from the substrate 10 toward a main surface of the support body 40 opposite to the substrate 10. In other words, the cross-sectional area of the conductive film 41 in plan view from the support body 40 increases from the side close to the substrate 10 toward the side far from the substrate 10. The conductive film 41 may have an inverse tapered shape and have a sectional shape that narrows from the substrate 10 toward the main surface of the support body 40 opposite to the substrate 10. In other words, the cross-sectional area of the conductive film 41 in plan view from the support body 40 may decrease from the side close to the substrate 10 toward the side far from the substrate 10. Consequently, in the electronic device 100A, a portion of the conductive film 41 having high thermal conductivity is increased in a direction in which the heat generated in the functional elements 11 and the electrodes 12 is dissipated. Thus, heat dissipation can be further improved.

Figure 3:
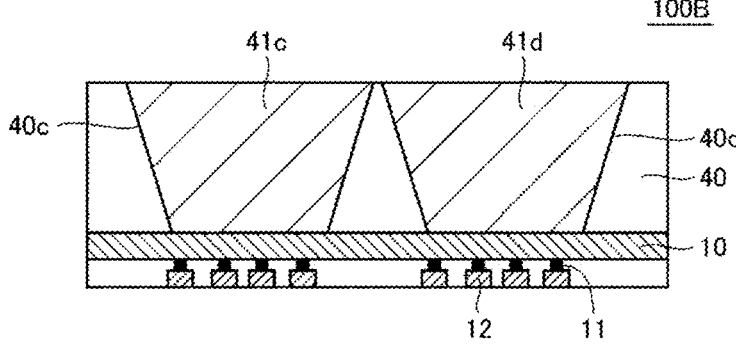
FIG. 3 is a sectional view of another different electronic device according to Preferred Embodiment 1 of the present invention.

Further, in the electronic device 100 illustrated in FIG. 1, the single conductive film 41 is provided at the support body 40. The number of the conductive films provided at the support body 40 is, however, not limited to one. For example, the number of the conductive films 41 provided at the support body 40 may be the same as the number of regions in each of which the functional elements 11 are collectively provided. FIG. 3 is a sectional view of another different electronic device 100B according to Preferred Embodiment 1. Note that the same components of the electronic device 100B illustrated in FIG. 3 as the components of the electronic device 100 illustrated in FIG. 1 are given the same signs and will not be described in detail repeatedly.

In the electronic device 100B, two through holes 40c and 40d are formed in the support body 40. In other words, in the electronic device 100B, the through hole 40c is provided correspondingly to a region of the functional elements 11 provided on the left side in FIG. 3, and the through hole 40d is provided correspondingly to a region of the functional elements 11 provided on the right side in FIG. 3. A conductive film 41c that has a higher thermal conductivity than the support body 40 is formed in the through hole 40c, and a conductive film 41d that has a higher thermal conductivity than the support body 40 is formed in the through hole 40d. Each of the conductive films 41c and 41d has a tapered shape and has a sectional shape that widens from the substrate 10 toward the main surface of the support body 40 opposite to the substrate 10. Consequently, in the electronic device 100B, the heat generated in each of the regions in which the functional elements 11 and the electrodes 12 are provided can be transferred to a corresponding one of the conductive films 41c and 41d, and heat dissipation can be further improved. Each of the conductive films 41c and 41d is preferably provided at a position where at least a portion thereof overlaps, in the substrate 10 in plan view from the support body 40, a corresponding one of the regions in which the functional elements 11 are provided.

As described above, the electronic devices 100, 100A, and 100B according to Preferred Embodiment 1 each include the substrate 10, which is a piezoelectric substrate or a compound semiconductor substrate that has one main surface (first main surface) provided with the functional elements 11. The support body 40 provided at the other main surface (second main surface) of the substrate 10 opposite to the one main surface, the support body 40 having a higher thermal conductivity than the substrate 10; and the conductive film 41 formed in the through hole 40a, 40b, 40c, or 40d that extends through the support body 40 and having a higher thermal conductivity than the support body 40. When having a higher thermal conductivity than the support body 40, the conductive film 41 may be a through body having no electrical conductivity.

Consequently, since the conductive film 41 formed in the through hole 40a, 40b, 40c, or 40d extending through the support body 40 has a higher thermal conductivity than the support body 40, each of the electronic devices 100, 100A, and 100B according to Preferred Embodiment 1 can improve heat dissipation by dissipating heat from, in the substrate 10 including one main surface provided with the functional elements 11, the other main surface of the substrate opposite to the one main surface.

Preferably, the conductive film 41 includes at least a portion that overlaps, in the substrate 10 in plan view from the support body 40, the region in which the functional elements 11 are provided. Consequently, each of the electronic devices 100, 100A, and 100B can improve heat dissipation by transferring the heat of the functional elements 11 provided at the one main surface to the conductive film 41 and dissipating the heat from the other main surface of the substrate 10.

Preferably, the conductive film 41 has a tapered shape and has a sectional shape that widens from the substrate 10 toward the main surface of the support body 40 opposite to the substrate 10. Consequently, the electronic device 100A and 100B can ensure a heat conduction path that widens from the other main surface of the substrate 10.

Preferably, the support body 40 includes at least one of a mixture of a metal and a resin, silicon, silicon carbide, aluminum oxide, boron nitride, aluminum nitride, silicon nitride, copper, and nickel.

Preferred Embodiment 2

Regarding the electronic devices 100, 100A, and 100B according to Preferred Embodiment 1, a configuration in which the support body 40 is provided at the substrate 10 has been described. Regarding an electronic device according to Preferred Embodiment 2, an example in which a component other than the support body 40 is provided at the other main surface of the substrate 10 will be described.

Figure 4:
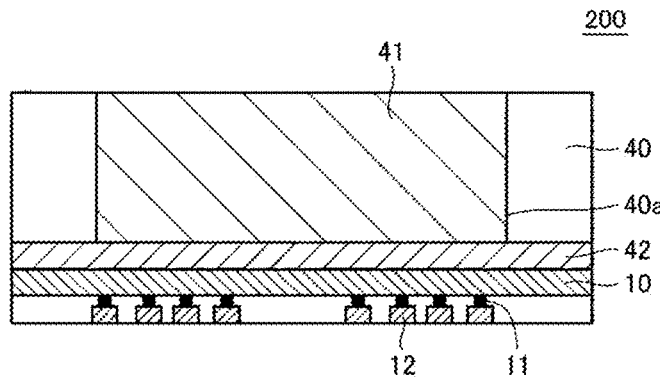
FIG. 4 is a sectional view of an electronic device according to Preferred Embodiment 2 of the present invention.

FIG. 4 is a sectional view of an electronic device 200 according to Preferred Embodiment 2. Note that the same components of the electronic device 200 illustrated in FIG. 4 as the components of the electronic device 100 illustrated in FIG. 1 are given the same signs and will not be described in detail repeatedly.

In the electronic device 200, an insertion layer 42 is provided between the substrate 10 and the support body 40. The insertion layer 42 has a higher thermal conductivity than the substrate 10 and the support body 40. Therefore, heat dissipation from the other main surface of the substrate 10 can be further improved. The insertion layer 42 may be provided, instead of at the entire surface between the substrate 10 and the support body 40, only at a portion that includes a region of the substrate 10 where the functional elements 11 and the electrodes 12 are provided in plan view from the support body 40. As a material of the highly thermally conductive insertion layer 42, a metal material including copper mainly or the like is preferably selected. The conductive film 41 formed in the through hole 40a is in contact with the insertion layer 42.

Figure 5:
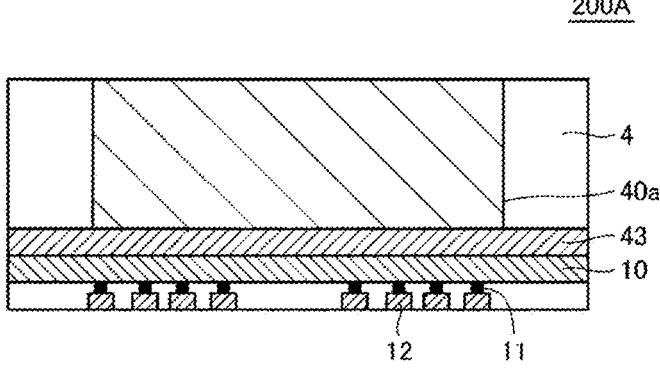
FIG. 5 is a sectional view of a different electronic device according to Preferred Embodiment 2 of the present invention.

FIG. 5 is a sectional view of a different electronic device 200A according to Preferred Embodiment 2. Note that the same components of the electronic device 200A illustrated in FIG. 5 as the components of the electronic device 100 illustrated in FIG. 1 are given the same signs and will not be described in detail repeatedly.

In the electronic device 200A, an intermediate layer 43 is provided between the substrate 10 and the support body 40 so as to be in contact with the substrate 10. The intermediate layer 43 has a coefficient of linear expansion that is between the coefficient of linear expansion of the substrate 10 and the coefficient of linear expansion of the support body 40. Therefore, a compressive stress can be applied by the intermediate layer 43 to the substrate 10 at the time of a temperature increase. In particular, when the substrate 10 is a crystalline substrate, the compressive stress of the intermediate layer 43 can reduce or prevent generation of cracking of the substrate 10 due to a tensile stress being applied to the substrate 10 at the time of a temperature increase. As a material of the intermediate layer 43, a material that contains copper (Cu), gold (Au), platinum (Pt), titanium (Ti), tantalum (Ta), tungsten (W), or the like can be used. In addition, an intermediate layer that is made of a material having a coefficient of linear expansion smaller than the coefficients of linear expansion of the support body 40 and the substrate 10 may be provided on the support body 40. The conductive film 41 formed in the through hole 40a is in contact with the intermediate layer 43.

Figure 6:
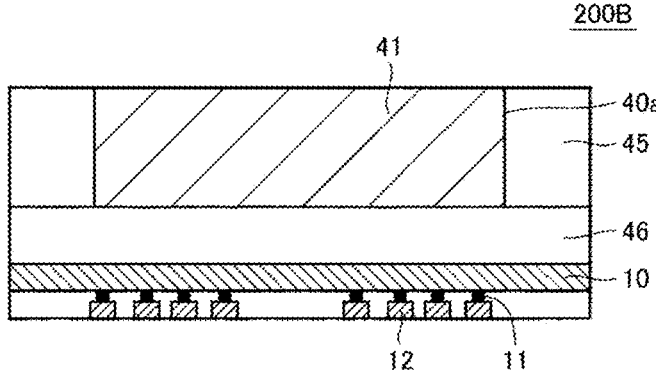
FIG. 6 is a sectional view of another different electronic device according to Preferred Embodiment 2 of the present invention.

FIG. 6 is a sectional view of another different electronic device 200B according to Preferred Embodiment 2. Note that the same components of the electronic device 200B illustrated in FIG. 6 as the components of the electronic device 100 illustrated in FIG. 1 are given the same signs and will not be described in detail repeatedly.

The electronic device 200B is one example applied to a surface acoustic wave device, the substrate 10 is a piezoelectric substrate, and the support body serves as a high-acoustic-velocity support substrate 45 through which bulk waves propagate at a higher acoustic velocity than acoustic waves, such as surface acoustic waves and boundary waves, propagating through the piezoelectric substrate. In addition, the electronic device 200B is further provided with a low-acoustic-velocity film 46 between the substrate 10 and the high-acoustic-velocity support substrate 45 and through which bulk waves propagate at a lower acoustic velocity than acoustic waves propagating through the piezoelectric substrate. In other words, the electronic device 200B has a multilayer structure in which the substrate 10, the low-acoustic-velocity film 46, and the high-acoustic-velocity support substrate 45 are laminated in this order. The through hole 40a is formed in the high-acoustic-velocity support substrate 45, and the conductive film 41 is in contact with the low-acoustic-velocity film 46.

The substrate 10 may be, for example, a 50° Y-cut X-propagation LiTaO$_3$ piezoelectric single crystal or piezoelectric ceramics (a lithium tantalate single crystal or ceramics cut along a plane that has, as a normal line, an axis rotated by 50° from the Y-axis with the X-axis as the center axis and through which acoustic waves propagate in the X-axis direction). For example, when a wavelength determined by an electrode finger pitch of IDT electrodes, which are the functional elements 11, is $\lambda$, the thickness of the substrate 10 is less than or equal to about 3.5$\lambda$, for example.

The high-acoustic-velocity support substrate 45 is a substrate that supports the low-acoustic-velocity film 46 and the substrate 10 provided with the functional elements 11. The high-acoustic-velocity support substrate 45 is also a substrate in which the acoustic velocity of bulk waves in the high-acoustic-velocity support substrate 45 is higher than the acoustic velocity of acoustic waves, such as surface acoustic waves and boundary waves, propagating through the substrate 10, and the high-acoustic-velocity support substrate 45 functions to confine acoustic waves in a portion where the substrate 10 and the low-acoustic-velocity film 46 are laminated so as not to leak upward in FIG. 14 from the high-acoustic-velocity support substrate 45. The thickness of the high-acoustic-velocity support substrate 45 is, for example, about 120 μm.

The low-acoustic-velocity film 46 is a film in which the acoustic velocity of bulk waves in the low-acoustic-velocity film 46 is lower than the acoustic velocity of acoustic waves propagating through the substrate 10 and is disposed between the substrate 10 and the high-acoustic-velocity support substrate 45. This structure and a property of acoustic waves that energy thereof basically concentrates in a medium in which acoustic velocity is low suppress leaking of acoustic wave energy to the outside of the IDT electrodes as the functional elements 11. The thickness of the low-acoustic-velocity film 46 is, for example, about 670 nm. With this multilayer structure, the Q-value at a resonant frequency and an anti-resonant frequency can be significantly increased compared with a structure in which the piezoelectric substrate is used as a single layer. In other words, since a surface acoustic wave resonator having a high Q-value can be configured, it is possible to configure a filter in which an insertion loss is small by using the acoustic wave resonator.

As a material of the high-acoustic-velocity support substrate 45, a piezoelectric, such as aluminum nitride, aluminum oxide, silicon carbide, silicon nitride, silicon, sapphire, lithium tantalate, lithium niobate, or crystal, ceramics such as alumina, zirconia, cordierite, mullite, steatite, or forsterite, magnesia diamond, a material including one of the aforementioned materials as a main component, or a material including a mixture of the aforementioned materials can be used.

The low-acoustic-velocity film 46 is made of, for example, a material including, as a main component, glass, silicon oxynitride, tantalum oxide, or a compound in which fluorine, carbon, or boron is added to silicon oxide. The material of the low-acoustic-velocity film 46 is at least a material having a relatively low acoustic velocity.

The high-acoustic-velocity support substrate 45 may have a structure in which a support body and a high-acoustic film through which bulk waves propagate at a higher acoustic velocity than acoustic waves, such as surface acoustic wave and boundary waves, propagating through the substrate 10 are laminated. In this case, in the support body, a piezoelectric such as sapphire, lithium tantalate, lithium niobate, or crystal, various types of ceramics such as alumina, magnesia, silicon nitride, aluminum nitride, silicon carbide, zirconia, cordierite, mullite, steatite, or forsterite, a dielectric such as glass, a semiconductor such as silicon or gallium nitride, a resin substrate, or the like can be used. In the high-acoustic film, a variety of high-acoustic-velocity materials including aluminum nitride, aluminum oxide, silicon carbide, silicon nitride, silicon oxynitride, a DLC film, diamond, a medium including one of the aforementioned materials as a main component, and a medium including a mixture of the aforementioned materials as a main component can be used.

As described above, the electronic device 200 according to Preferred Embodiment 2 further includes, between the support body 40 and the substrate 10, the insertion layer 42 that has a higher thermal conductivity than the substrate 10 and the support body 40. Consequently, it is possible to further improve the heat dissipation from the other main surface of the substrate 10.

In addition, the electronic device 200A according to Preferred Embodiment 2 further includes, between the substrate 10 and the support body 40, the intermediate layer 43 that is provided in contact with the substrate 10 and that has a coefficient of linear expansion that is between the coefficient of linear expansion of the substrate 10 and the coefficient of linear expansion of the support body 40. Consequently, a compressive stress can be applied by the intermediate layer 43 to the substrate 10 at the time of a temperature increase.

Further, in the electronic device 200B according to Preferred Embodiment 2, the substrate is a piezoelectric substrate, the support body 40 is the high-acoustic-velocity support substrate 45 through which bulk waves propagate at a higher acoustic velocity than acoustic waves, such as surface acoustic waves and boundary waves, propagating through the piezoelectric substrate, and the electronic device 200B further includes the low-acoustic-velocity film 46 provided between the substrate 10 and the high-acoustic-velocity support substrate 45 and through which bulk wave propagate at a lower acoustic velocity than acoustic waves propagating through the substrate 10. Consequently, it is possible to confine acoustic waves in a portion where the substrate 10 and the low-acoustic-velocity film 46 are laminated so as not to leak upward from the high-acoustic-velocity support substrate 45.

The configurations of the electronic devices 200, 200A, and 200B described in Preferred Embodiment 2 may be combined together, as appropriate.

Preferred Embodiment 3

A configuration in which the electronic device 100 according to Preferred Embodiment 1 is mounted on a base substrate will be described in Preferred Embodiment 3. Note that the configurations of the electronic devices 100A and 100B according to Preferred Embodiment 1 and the electronic devices 200, 200A, and 200B according to Preferred Embodiment 2 may be applied to the configuration described in Preferred Embodiment 3.

Figure 7:
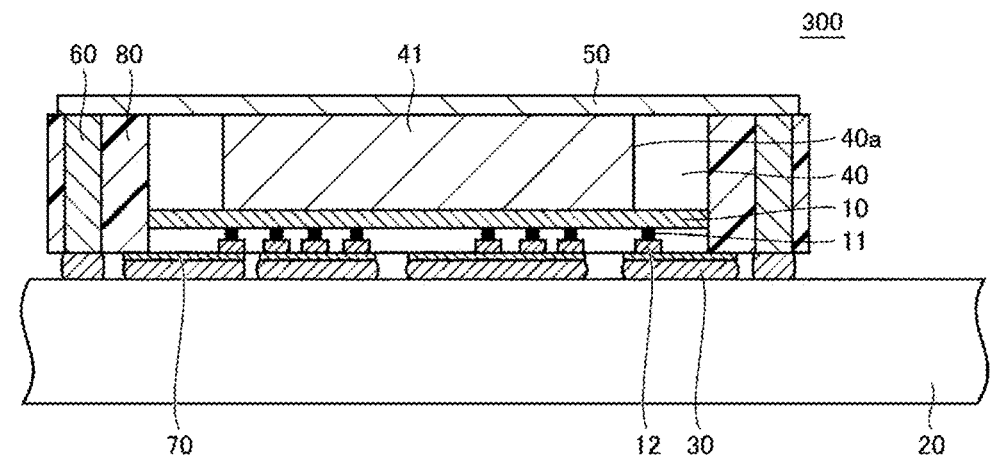
FIG. 7 is a sectional view of an electronic device according to Preferred Embodiment 3 of the present invention.

FIG. 7 is a sectional view of an electronic device 300 according to Preferred Embodiment 3. Note that the same components of the electronic device 300 illustrated in FIG. 7 as the components of the electronic device 100 illustrated in FIG. 1 are given the same signs and will not be described in detail repeatedly. In the electronic device 300 according to Preferred Embodiment 3, one main surface (first main surface) of the substrate 10 is provided with the functional elements 11, and the substrate 10 is mounted on a base substrate 20 such that the main surface provided with the functional elements 11 faces the base substrate 20. The base substrate 20 may be a package substrate made of a glass epoxy resin, alumina, and the like, a silicon substrate, a piezoelectric substrate (lithium niobate (LN), lithium tantalate (LT)), a component-embedded board (a laminate of polyimide, an epoxy resin, metal wiring, and the like), or the like.

By electrically connecting the electrodes 12 of the functional elements 11 and a metal connection body 30, such as a bump, provided on the base substrate 20 to each other, electric power and a signal can be supplied to the functional elements 11 from the base substrate 20. Preferably, the metal connection body 30 includes at least a portion that extends to outside the substrate 10 in plan view from the support body 40. In other words, preferably, the metal connection body 30 is provided to extend from inside the substrate 10 to outside the substrate 10 in plan view from the support body 40. In the electronic device 300 illustrated in FIG. 7, a metal body 70 (second metal body) is provided between the electrodes 12 and the metal connection body 30, and the electrodes 12 and the metal connection body 30 are electrically connected to each other with the metal body 70 interposed therebetween. The electrodes 12 and the metal connection body 30 may be electrically connected to each other without the metal body 70 provided therebetween. Preferably, the metal body 70 is provided to extend to the metal connection body 30 outside the substrate 10 in plan view from the support body 40. In other words, preferably, the metal body 70 is provided to extend from inside the metal connection body 30 to outside the metal connection body 30 in plan view from the support body 40.

In addition, in the electronic device 300, the metal body 50 (first metal body) is provided at a surface of the support body 40 on a side opposite to a side in contact with the substrate 10. At least a portion of the metal body 50 extends to outside the substrate 10 in plan view from the support body 40. In other words, the metal body 50 is provided to extend from inside the substrate 10 to outside the substrate 10 in plan view from the support body 40. The portion of the metal body 50 provided outside is located on both sides of opposing sides of the substrate 10 in plan view from the support body 40.

This portion of the metal body 50 outside the substrate 10 and the base substrate 20 are connected to each other by a via 60. In the metal body 50, for example, copper, aluminum (Al), or the like is used. In the via 60, for example, at least one of a copper-based conductive paste solidified material and a silver-based conductive paste solidified material that have higher thermal conductivity than the substrate 10 is used. While the via 60 illustrated in FIG. 7 is connected to the base substrate 20 with the metal connection body 30 interposed therebetween, the via 60 may be connected directly to the base substrate 20 without the metal connection body 30 interposed therebetween or connected to the base substrate 20 with the metal connection body 30 and the metal body 70 interposed therebetween.

As a result of the metal body 50 and the base substrate 20 being connected to each other by the via 60, a new heat conduction path along which the heat generated in the functional elements 11 and the electrodes 12 is transferred from the metal body 50 through the via 60 to the base substrate 20 can be ensured. Specifically, the new heat conduction path is a heat conduction path along which the heat generated in the functional elements 11 and the electrodes 12 is transferred to the substrate 10, the support body 40, the metal body 50, the via 60, the metal connection body 30, and the base substrate 20 in this order to be dissipated from the other main surface of the substrate 10. Consequently, the electronic device 300 can improve heat dissipation not only from the one main surface (first main surface) of the substrate 10 but also from the other main surface (second main surface) of the substrate 10.

It is preferable in the electronic device 300 that a cross-sectional area that is obtained by cutting the portion of the via 60 connected to the metal connection body 30 in a lateral direction orthogonal to the laminate direction of the metal connection body 30 and the via 60 be larger than at least one of cross-sectional areas obtained by cutting a plurality of the metal connection bodies 30 in the lateral direction. By increasing the cross-sectional area of the via 60, it is possible to ensure a large heat conduction path along which heat is transferred from the metal connection body 30 to the via 60 and reaches the metal body 50 and possible to further improve the heat dissipation from the other main surface of the substrate 10.

As illustrated in FIG. 7, the electronic device 300 can be considered to have a configuration in which a chip having a structure in which the substrate 10 provided with the functional elements 11 and the electrodes 12, and the support body 40 and the conductive film 41 are laminated is face-down mounted on the base substrate 20. While the functional elements 11 and the electrodes 12 are illustrated with the substrate 10, a protective film, routing wiring, an electrically insulating layer, and the like may be provided in addition to these components. Further, in the electronic device 300, the metal body 50 is provided on the back side (the surface opposite to the surface provided with the functional elements 11) of the substrate 10 that is face-down mounted on the base substrate 20, and the via 60 that connects the metal body 50 and the base substrate 20 to each other is disposed. Preferably, the metal body 50 is provided on the support body 40 and the conductive film 41 so as to include a region of the substrate 10 where the functional elements 11 and the electrodes 12 are provided in plan view from the support body 40. Consequently, the heat that is transferred to the back surface (the other main surface) of the substrate 10 provided with the functional elements 11 can be dissipated by the metal body 50.

The electronic device 300 illustrated in FIG. 7 is provided with an insulator 80 that covers a side surface of the substrate 10 and a side surface of the support body 40. The side surface of the substrate 10 is a surface that connects the one main surface of the substrate 10 provided with the functional elements 11 and the other main surface of the substrate 10 opposite to the surface provided with the functional elements 11 to each other. The side surface of the support body 40 is a surface that connects the surface of the support body 40 close to the substrate 10 and the surface of the support body 40 opposite to the surface close to the substrate 10 to each other. The via 60 is formed in the insulator 80 provided at the side surface of the substrate 10 and the side surface of the support body 40 and can ensure electrical insulation from the substrate 10 and the support body 40. The electronic device 300 may be configured such that the substrate 10 and another electronic component are mounted on the base substrate 20 and sealed by a common sealing material (insulator), and the metal body 50 is disposed over the sealing material.

Figure 8:
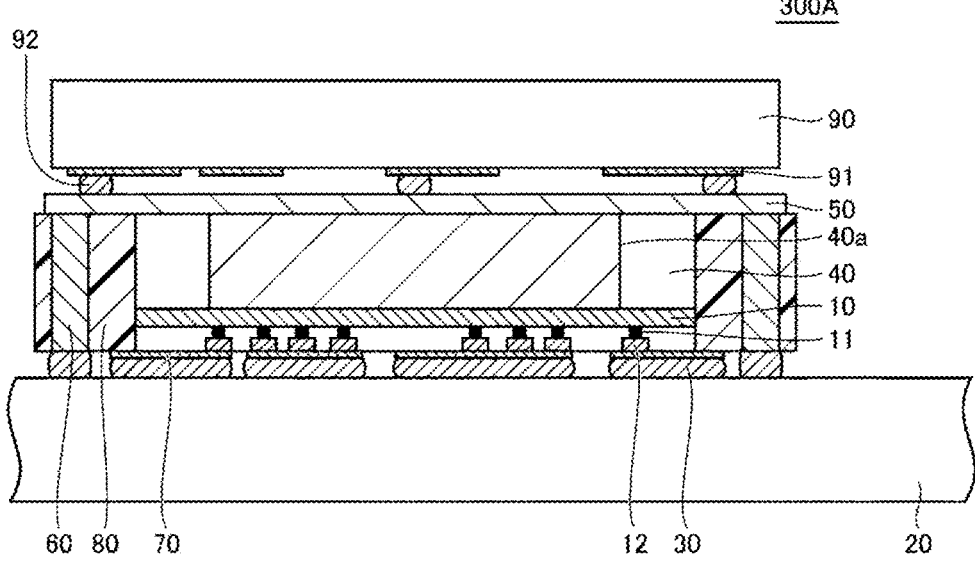
FIG. 8 is a sectional view of a different electronic device according to Preferred Embodiment 3 of the present invention.

Next, a configuration of an electronic device in which an electronic component is mounted on a surface of a metal body on a side opposite to a side in contact with a support body will be described. FIG. 8 is a sectional view of a different electronic device 300A according to Preferred Embodiment 3. Components from the base substrate 20 to the metal body 50 in the electronic device 300A are the same as the components in the electronic device 300 illustrated in FIG. 7. The same components are given the same signs and will not be described in detail repeatedly. The components from the base substrate 20 to the metal body 50 in the other electronic devices described according to preferred embodiments of the present disclosure may be applied to those in the electronic device 300A.

In the electronic device 300A illustrated in FIG. 8, an electronic component 90 is surface mounted on a surface of the metal body 50 on a side opposite to a side that is in contact with the support body 40. Specifically, the electronic component 90 is, for example, flip-chip mounted, and electrodes 91 and an electrode that is provided at a surface of the metal body 50 are connected to each other by bumps 92.

Figures 9, 10:
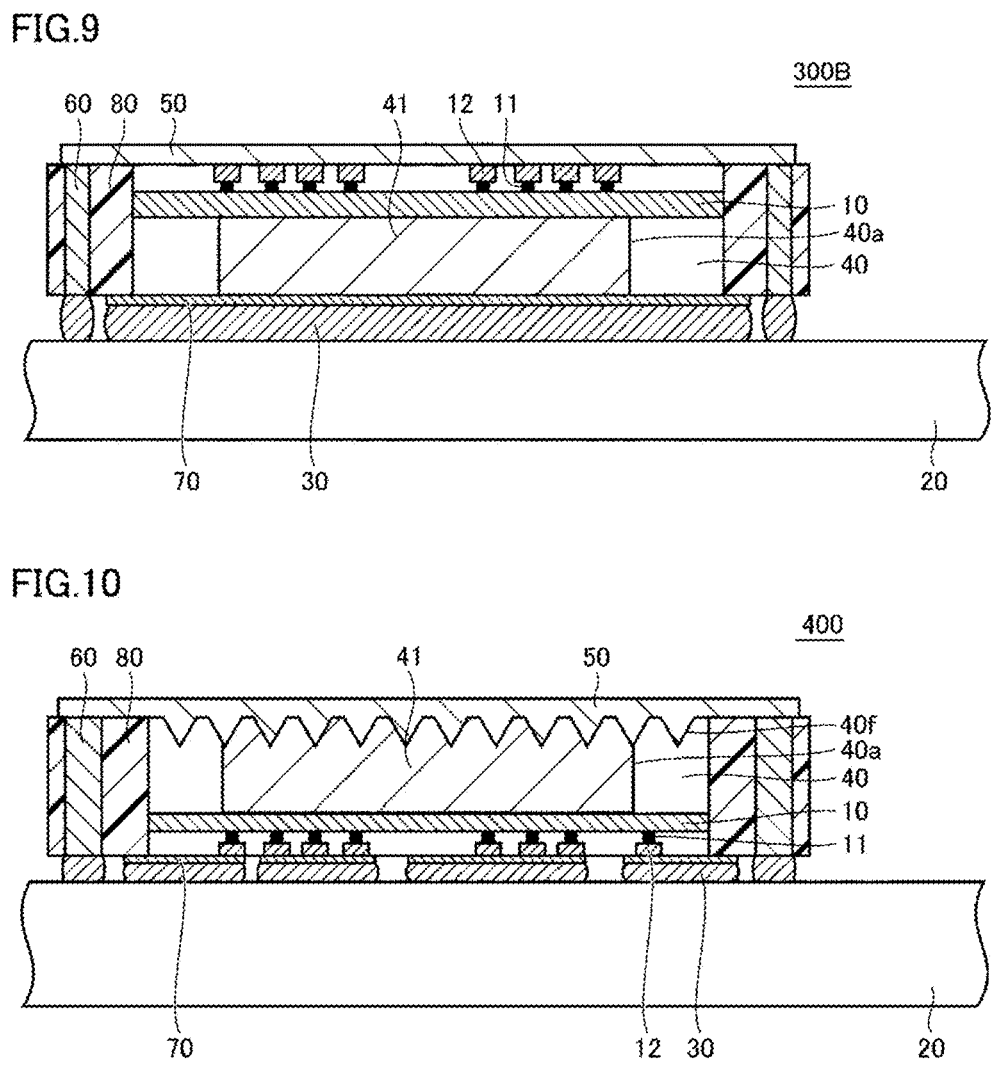

Next, a configuration in which a chip of the substrate 10 at which the support body 40 and the conductive film 41 are laminated is face-up mounted on the base substrate 20 will be described. FIG. 9 is a sectional view of another different electronic device 300B according to Preferred Embodiment 3. Note that the same components of the electronic device 300B illustrated in FIG. 9 as the components of the electronic device 300 illustrated in FIG. 7 are given the same signs and will not be described in detail repeatedly.

In the electronic device 300B, one main surface (first main surface) of the substrate 10 is provided with the functional elements 11, and the substrate 10 is mounted on the base substrate 20 such that another main surface (second main surface) of the substrate 10 opposite to the one main surface faces the base substrate 20. In other words, as illustrated in FIG. 9, the electronic device 300B has a configuration in which a chip of the substrate 10 provided with the functional elements 11 and the electrodes 12 is face-up mounted on the base substrate 20. While the functional elements 11 and the electrodes 12 are illustrated with the substrate 10, a protective film, routing wiring, an electrically insulating layer, and the like may be provided in addition to these components.

Further, in the electronic device 300B, the metal body 50 is provided on the front side (the surface provided with the functional elements 11) of the substrate 10 face-up mounted on the base substrate 20, and the via 60 that connects the metal body 50 and the base substrate 20 to each other is disposed. Preferably, the metal body 50 is provided on the substrate 10 so as to include a region of the substrate 10 where the functional elements 11 and the electrodes 12 are provided in plan view from the one main surface. Consequently, it is possible to form a heat dissipation path that increases the amount of heat transferred to the metal body 50 from the surface (the one main surface) of the substrate 10 where the functional elements 11 are provided and thus is possible to improve heat dissipation.

In the electronic device 300B, the support body 40 is disposed at the other main surface (the main surface of the substrate 10 opposite to the main surface provided with the functional elements 11) of the substrate 10. The support body 40 has a higher thermal conductivity than the substrate 10. The through hole 40a is provided in the support body 40, and the conductive film 41 is formed in the through hole 40a. The metal connection body 30 connects the other main surface of the substrate 10 and the base substrate 20 to each other with the support body 40 and the conductive film 41 interposed therebetween.

As described above, each of the electronic devices 300 and 300A according to Preferred Embodiment 3 further includes the base substrate 20 on which the substrate 10 is mounted such that one main surface thereof faces the base substrate 20 and further includes an insulator that covers a side surface of the substrate 10 and a side surface of the support body 40. In addition, the electronic device 300B according to Preferred Embodiment 3 further includes the base substrate 20 on which the substrate 10 is mounted such that the other main surface side thereof faces the base substrate 20. Consequently, it is possible to realize electronic devices having various configurations by using the electronic device in which heat dissipation is improved.

Other Modifications

FIG. 10 is a sectional view of an electronic device 400 according to a modification of a preferred embodiment of the present invention. Note that the same components of the electronic device 400 illustrated in FIG. 10 as the components of the electronic device 100 illustrated in FIG. 1 and the electronic device 300 illustrated in FIG. 7 are given the same signs and will not be described in detail repeatedly. The modification can be applied, as appropriate, to the configurations of the electronic devices described above.

In the electronic device 400, the support body 40 and the conductive film 41 each have surface roughness that is larger on a surface close to the metal body 50 than on a surface close to the substrate 10. In other words, a surface roughness 40f of each of the surfaces of the support body 40 and the conductive film 41 close to the metal body 50 is larger than the surface roughness of the surfaces thereof close to the substrate 10. Consequently, a contact area in which the support body 40 and the conductive film 41 are in contact with the metal body 50 is increased. It is thus possible to improve heat dissipation to the metal body 50. Only the surface roughness 40f of the surface of the conductive film 41 close to the metal body 50 may be larger than the surface roughness on the surface close to the substrate 10.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device comprising:
a functional element substrate including a first main surface provided with a functional element that is a piezoelectric substrate or a compound semiconductor substrate;
a support body that is provided at a second main surface of the functional element substrate opposite to the first main surface, the support body having a higher thermal conductivity than the functional element substrate; and
a through body located in a through hole extending through the support body and having a higher thermal conductivity than the support body; wherein
the through body includes at least a portion that overlaps, in the functional element substrate in plan view from the support body, a region in which the functional element is provided; and
the through body is exposed from each of a first surface of the support body that faces the second main surface of the functional element substrate and a second surface of the support body that is opposite to the first surface of the support body.

2. The electronic device according to claim 1, wherein the through body has a tapered shape and has a sectional shape that widens from the functional element substrate toward a main surface of the support body opposite to the functional element substrate.

3. The electronic device according to claim 1, wherein the support body includes at least one of a mixture of a metal and a resin, silicon, silicon carbide, aluminum oxide, boron nitride, aluminum nitride, silicon nitride, copper, and nickel.

4. The electronic device according to claim 1, further comprising:
an insertion layer between the support body and the functional element substrate, the insertion layer having a higher thermal conductivity than the functional element substrate and the support body.

5. The electronic device according to claim 1, further comprising:
an intermediate layer between the functional element substrate and the support body, the intermediate layer being in contact with the functional element substrate and having a coefficient of linear expansion that is between a coefficient of linear expansion of the functional element substrate and a coefficient of linear expansion of the support body.

6. The electronic device according to claim 1, wherein
the functional element substrate is a piezoelectric substrate;
the support body is a high-acoustic-velocity support substrate through which bulk waves propagate at a higher speed than acoustic waves that propagate through the piezoelectric substrate; and
the electronic device further comprises a low-acoustic-velocity film between the functional element substrate and the support body and through which bulk waves propagate at a lower velocity than acoustic waves that propagate through the piezoelectric substrate.

7. The electronic device according to claim 1, wherein the through body has a surface roughness that is larger on a surface opposite to a surface closer to the functional element substrate than on the surface closer to the functional element substrate.

8. The electronic device according to claim 1, further comprising:
an insulator that covers a side surface of the functional element substrate and a side surface of the support body.

9. The electronic device according to claim 1, further comprising:
a base substrate on which the functional element substrate is mounted such that the first main surface faces the base substrate.

10. The electronic device according to claim 1, further comprising:
a base substrate on which the functional element substrate is mounted such that the second main surface faces the base substrate.

11. The electronic device according to claim 1, wherein the functional element substrate is a piezoelectric substrate including at least one of crystal, $LiTaO_3$ $LiNbO_3$, $KNbO_3$, $La_3Ga_5SiO_{14}$, and $Li_2B_4O_7$.

12. The electronic device according to claim 1, wherein the functional element substrate is a compound semiconductor substrate including at least one of GaAs and GaN.

* * * * *